(12) United States Patent
Apel

(10) Patent No.: US 7,768,098 B2
(45) Date of Patent: Aug. 3, 2010

(54) INTEGRATED LOW INDUCTANCE INTERCONNECT FOR RF INTEGRATED CIRCUITS

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 880 days.

(21) Appl. No.: 11/473,470

(22) Filed: Jun. 23, 2006

(65) Prior Publication Data

US 2007/0296057 A1   Dec. 27, 2007

(51) Int. Cl.
*H01L 29/00* (2006.01)
(52) U.S. Cl. .................. 257/531; 257/532; 257/533
(58) Field of Classification Search ......... 257/531–533; 361/764, 765, 767
See application file for complete search history.

(56) References Cited

U.S. PATENT DOCUMENTS 4,168,507 A * 9/1979 Yester, Jr. .................. 257/531
4,827,327 A * 5/1989 Miyauchi et al. ............ 257/700
6,181,200 B1 * 1/2001 Titizian et al. ................ 330/66

* cited by examiner

*Primary Examiner*—Thinh T Nguyen

(57) ABSTRACT

An interconnect path configured for use in RFICs and configured to reduce inductance at the input of an array of cells, and also at the output of the array of cells. According to one preferred embodiment of the present invention, a multi-layered interconnect formed by at least two metal layers separated by dielectric medium is provided. The metal layers are closely spaced and separated by a desirable dielectric to achieve an interconnect having a characteristic inductance (Zo) that is much lower than typical microstrip transmission lines formed by a metal trace over the semiconductor substrate or a dielectric stack that includes the semiconductor substrate. The low Zo line provides much less inductance per unit length.

17 Claims, 7 Drawing Sheets

INTEGRATED LOW INDUCTANCE INTERCONNECT FOR RF INTEGRATED CIRCUITS

FIELD OF THE INVENTION

The present invention generally relates to integrated circuits, and more particularly to integrated circuits processing RF signals.

BACKGROUND OF THE INVENTION

Often, interconnect paths in radio frequency integrated circuits (RFICs) contribute undesirably large inductance due to the path lengths and line widths that are practically available. This large inductance can lead to low circuit performance. For example, an input signal providing a driving current to an RF power amplifier is desired to flow uniformly to each of the cells in an output stage array of cells. Non-uniformity in amplitude and/or phase across the array of cells can cause degradation in power efficiency, gain, and linearity. According to one conventional approach, a single metal layer over a dielectric stack that includes the semiconductor substrate (such as GaAs) is used to interconnect an input to an input terminal of each cell.

Another problem with RFICs is the problem of maintaining a uniform harmonic termination at the output terminal of each cell in an RF power amplifier output stage that is comprised of many individual transistor cells. According to one conventional approach, a single metal layer over a dielectric stack that includes the semiconductor substrate (such as GaAs) is used to interconnect the output terminal of each cell. Harmonic tuning will vary across the cell array due to differing path lengths. The harmonic tuning becomes more difficult as the path length, and correspondingly the inductance difference, between cells in the array and the harmonic tuning resonator accumulates.

There is desired an improved interconnect method for RF integrated circuits that provides a low inductance path between circuit elements at different physical locations. An example of this is the reduction of inductance at the input of an array of cells that are intended to operate in-phase and with equal amplitude. Another example is the desire to reduce interconnect inductance differences between, each transistor cell in an array, and a common harmonic tuning resonator.

DETAILED DESCRIPTION OF THE PRESENT INVENTION

Figure 1:
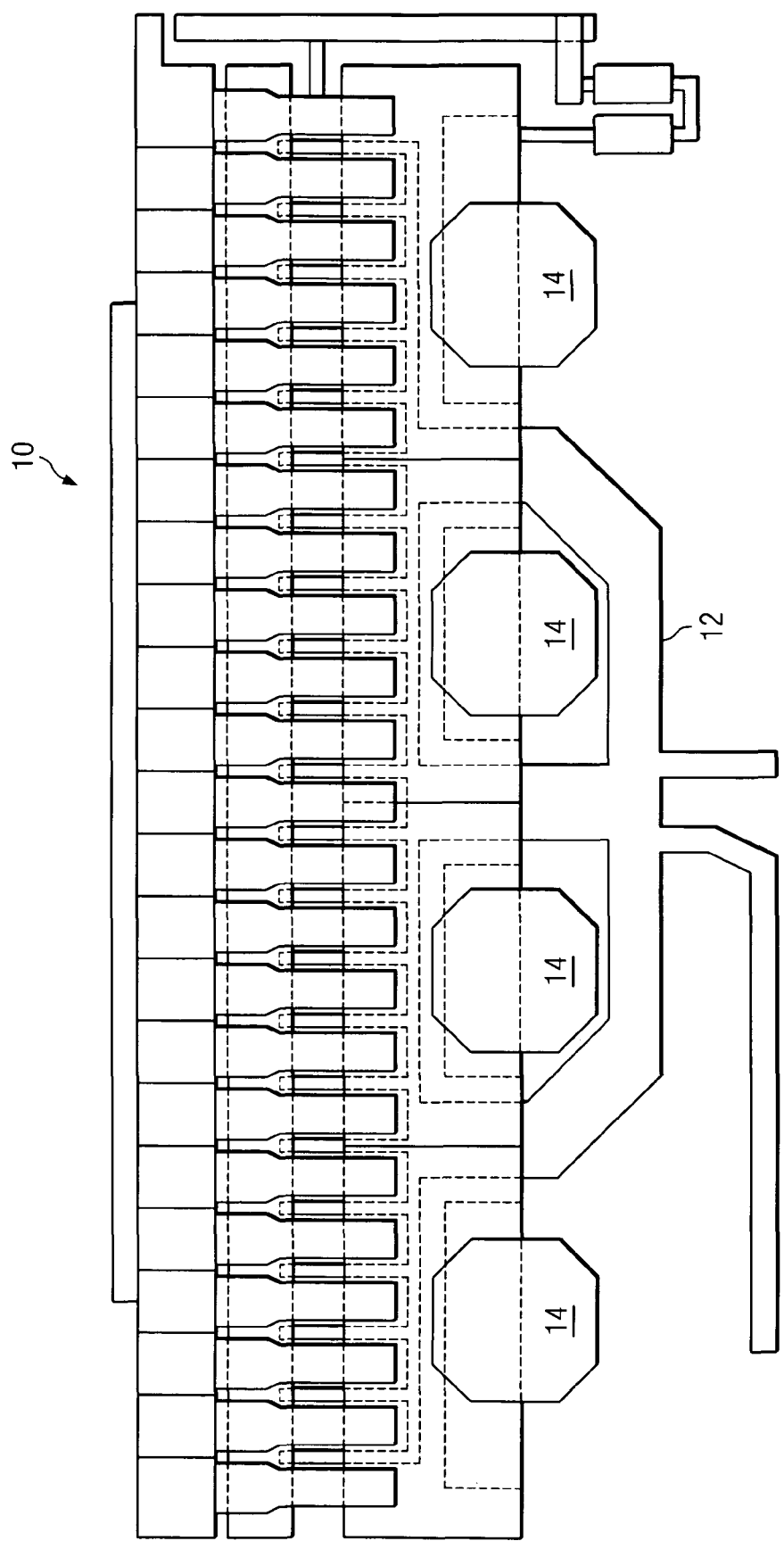
FIG. 1 is a top view of a conventional RFIC having a conventional interconnect formed by a single metal trace over the semiconductor substrate.

Referring now to FIG. 1, there is generally shown at 10 a top view of a conventional RFIC having conventional single metal layer interconnects 12 feeding a plurality of output transistor cells through circuit elements, such as capacitors, generally shown at 14. The conventional interconnect 12, such as a single metal layer disposed over semiconductor substrate or a dielectric stack, may typically create up to 100 pH of an inductance in a 24 cell array.

Figure 2:
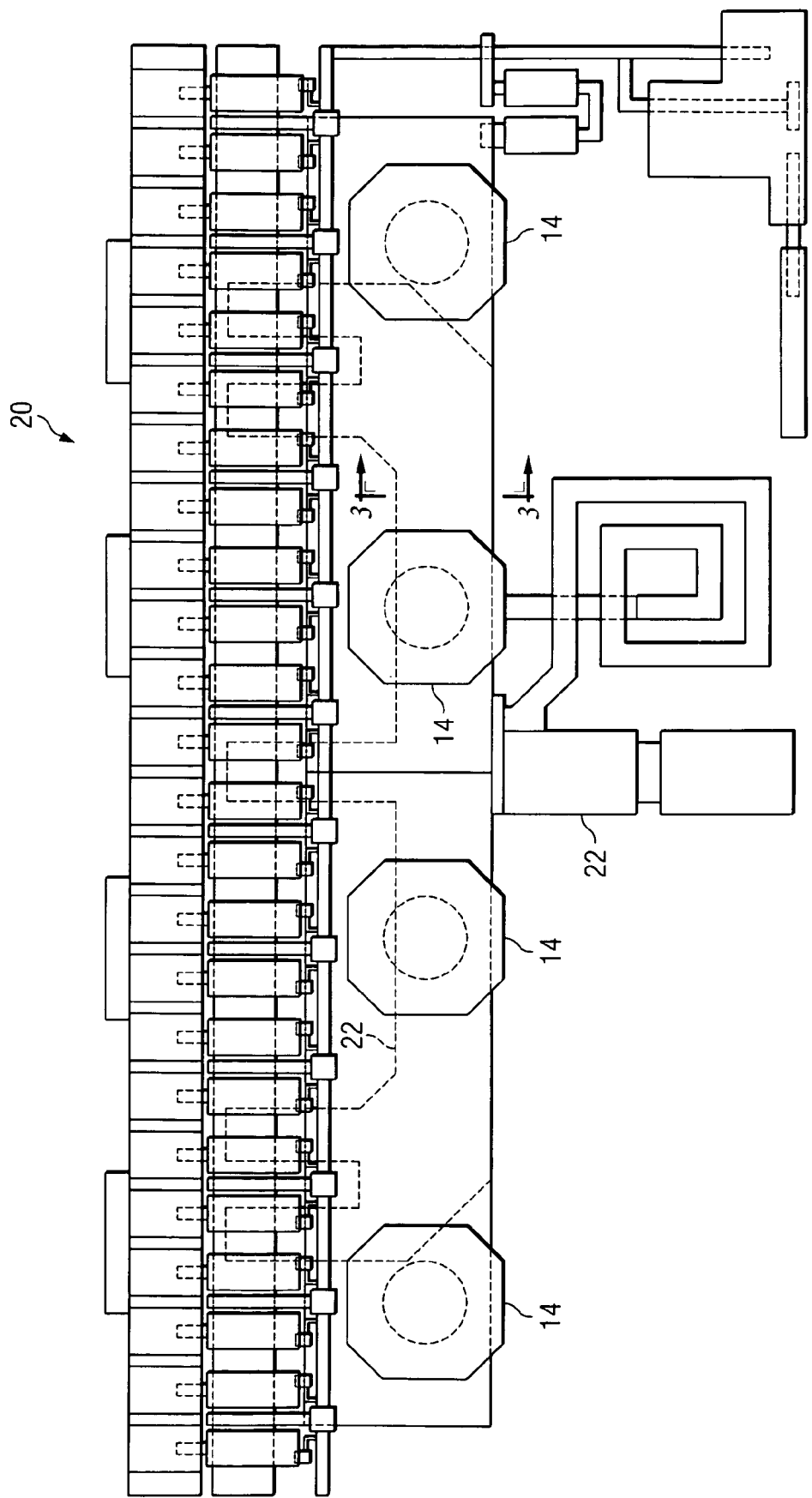
FIG. 2 is a top view of an RFIC according to one preferred embodiment of the present invention including an low inductance interconnect extending between an input of the output cells.

Referring now to FIG. 2, there is generally shown at 20 an RFIC having a plurality of output cells fed by low inductance interconnects 22 according to one preferred embodiment of the present invention. Interconnects 22 are seen to be employed in a single input and which has 3 branches, each branch connecting to a respective subset of output cells 14. Utilizing the improved interconnect of the present invention significantly reduces the combined inductance to the inputs of the output cells 14, by on the order of 50x, whereby the overall input equivalent inductance may be only 2 pH, where the remaining portions of the circuit are all the same as those shown in FIG. 1.

Figure 3:
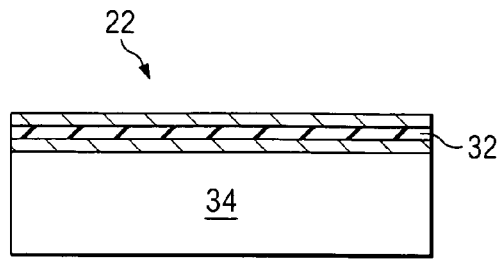
FIG. 3 is a side sectional view of the low inductance interconnect of FIG. 2 depicting the interconnect being formed by a pair of metal layers separated by a thin dielectric medium and disposed over a substrate.
Figure 4:
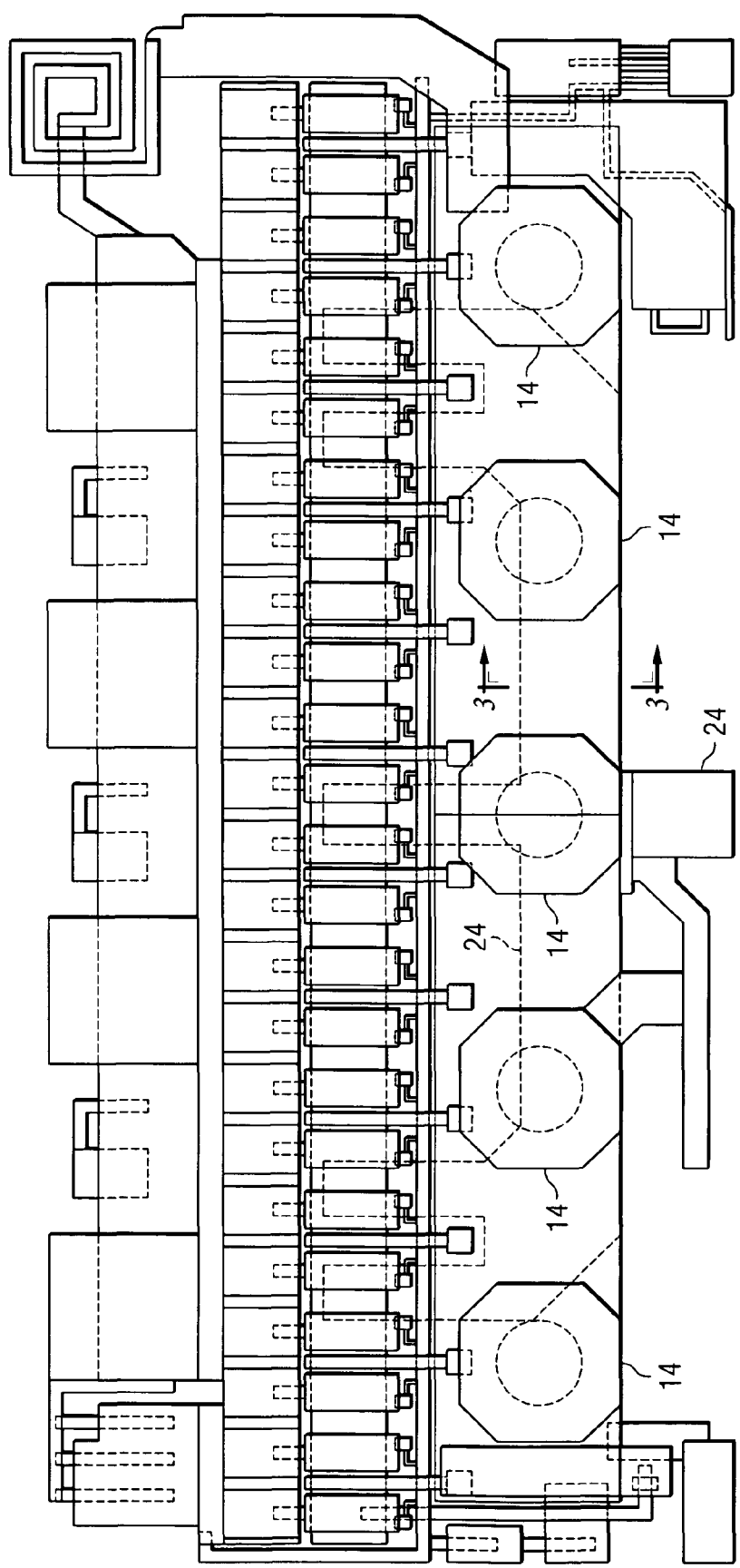
FIG. 4 is a top view of an RFIC whereby the low inductance interconnect has metal layers with similar width.

FIG. 3 depicts a side view of the improved interconnect 22 taken at lines 3-3 in FIG. 2, and depicts the interconnect 22 being comprised of two metal layers identified as metal-1 and metal-2 separated from each other by a thin dielectric medium 32 disposed therebetween. This arrangement of multiple metal layers and dielectric formed over the substrate 34 provides the desired low inductance interconnect. Preferably, one of the interconnect metal layers is patterned with greater width compared to the other. This is most often in metal-1, when one side is grounded, as in the example of FIG. 2. When wide metal is used in metal-1, the low impedance transmission line can be represented as a microstrip line. Alternatively, both layers can be patterned with similar width, as illustrated in FIG. 4.

Figure 5:
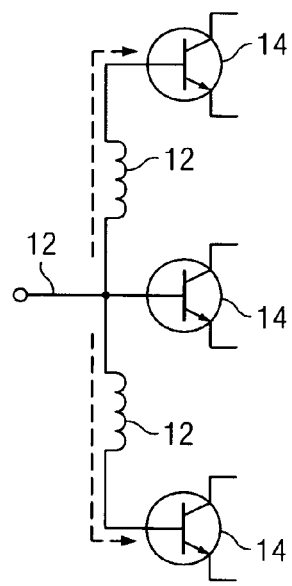
FIG. 5 is a schematic diagram depicting a conventional RFIC having a large inductance interconnect provided to the inputs of each output cell.

Referring now to FIG. 5, there is shown a schematic diagram of an array of 3-output cells, or alternatively 3 clusters of output cells, having a large inductance difference in the input paths to the output cells 14 represented as bipolar amplifiers. The large inductance difference to constituent cells in the array is due primarily to large differences in the interconnect path. Low impedance lines provide less inductance per unit length in all instances used. These large inductance differences between input interconnects 12 cause low performance of the RFIC as the driving current to each output cell 12 is non-uniform, which in turn creates non-uniformity in amplitude and/or phase that causes degradation in power efficiency, gain and linearity of the RFIC 10. By substantially reducing overall path inductance, the (smaller) differences in inductance between paths will also be correspondingly reduced.

Figure 6:
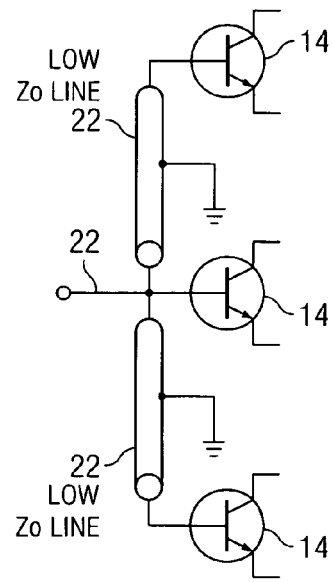
FIG. 6 is an electrical schematic depicting the low characteristic impedance interconnect extending between the various inputs of the output cells according to one embodiment of the present invention.

Turning now to FIG. 6, there is shown a schematic diagram from an RFIC having low inductance interconnects 22 according to one preferred embodiment of the present invention. The low inductance interconnects 22 between the inputs of transistor 14, shown as the base of the transistors, have small inductance differences due to the metal layers of interconnect 22 being separated by a very thin and stable dielectric medium 32, such as 1.3 μm of BCB, or Cyclotene manufactured by DOW Corporation. This is one example of a suitable dielectric medium. However, limitation to these dielectric mediums and thicknesses is not to be inferred. The low inductance, and uniform inductance, interconnects provide technical advantages by enabling a uniform driving current to be delivered to each input of the output amplifier cells 14.

Figure 7:
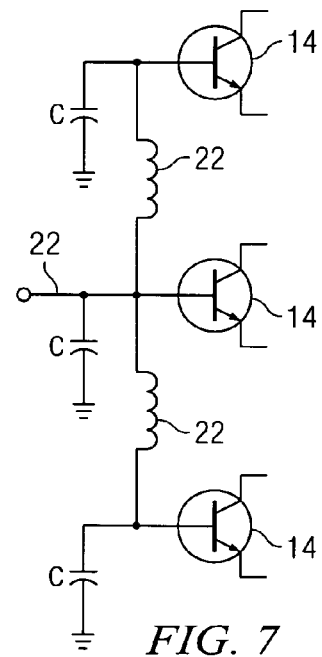
FIG. 7 is a lumped equivalent circuit model schematic diagram that represents the behavior of the schematic shown in FIG. 6.

Referring to FIG. 7, there is shown an lumped LC electrical equivalent model of the electrical diagram of FIG. 6, with the inductance of the interconnect 22 being shown, as well as the parasitic capacitances C at the input of the output cells, or arrays of cells, 14, depicted as being connected at the base of each output cell.

Figure 8:
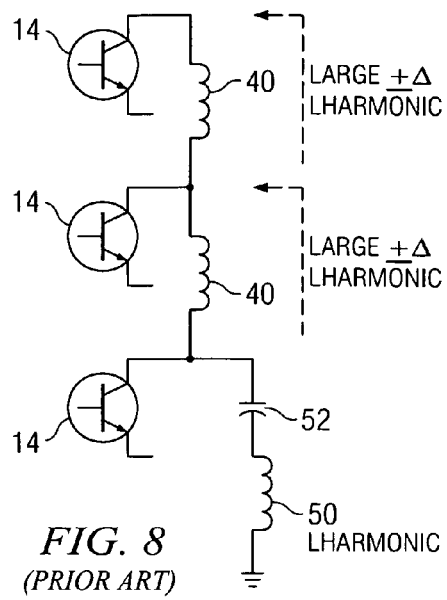
FIG. 8 is an electrical schematic of a conventional RFIC depicting the large variation of inductance, between outputs of the output cells and common ground, in view of the harmonic tuning inductor.

Referring now to FIG. 8, there is shown an electrical schematic depicting the inductance between the collectors of each transistor cell, or arrays of cells, 14, using conventional interconnects 40. Similarly, the connecting inductance could be shown between FET transistor drain connections, in applications where FETs are used. The output lateral interconnects 40 have inductances that are significantly large when compared with the common harmonic tuning inductance, $L_{HARMONIC}$, shown at 50. These lateral interconnect inductances between the output terminal of each output cell 14, in an RF power amplifier output stage, will vary the harmonic terminating impedance required across the output array 14 due to differing path lengths, and non-uniform inductances. Thus, the large inductances of interconnects 40 have a significant effect on the overall tuning being provided by the inductor 50 and the tuning capacitor 52.

Figure 9:
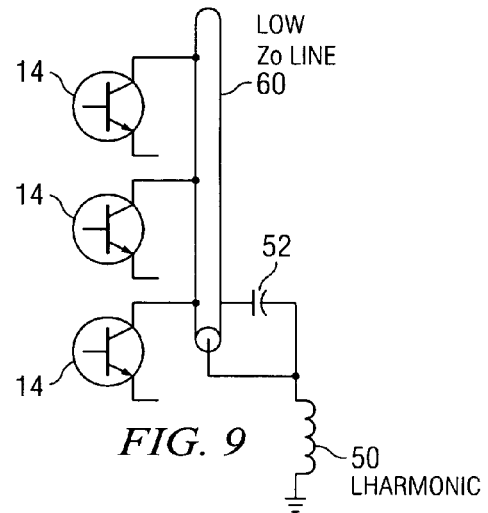
FIG. 9 depicts a schematic of the same output cells including the low characteristic impedance interconnect of the present invention.

Referring now to FIG. 9, there is shown a schematic diagram of an array of 3-output cells, or alternatively 3 clusters of output cells, in an RFIC utilizing the low inductance interconnect shown as low impedance interconnect 60 according to one preferred embodiment of the present invention.

Figure 10:
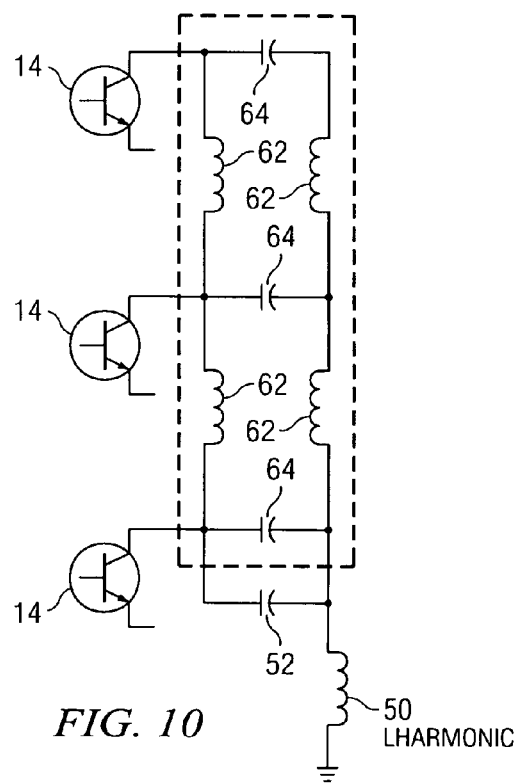
FIG. 10 is a lumped equivalent circuit model schematic diagram showing the lumped equivalent circuit representation of the schematic shown in FIG. 8.

FIG. 10 depicts a lumped LC equivalent circuit schematic diagram of that shown in FIG. 9, depicting each interconnect 60 between the output of adjacent cells as a pair of inductors 62 separated by parasitic capacitances 64. Further shown in FIG. 10 is the harmonic tuning circuit comprised of tuning inductor 50 and capacitor 52 being configured in series and connected to the output of the lower output cell 14.

Figure 11:
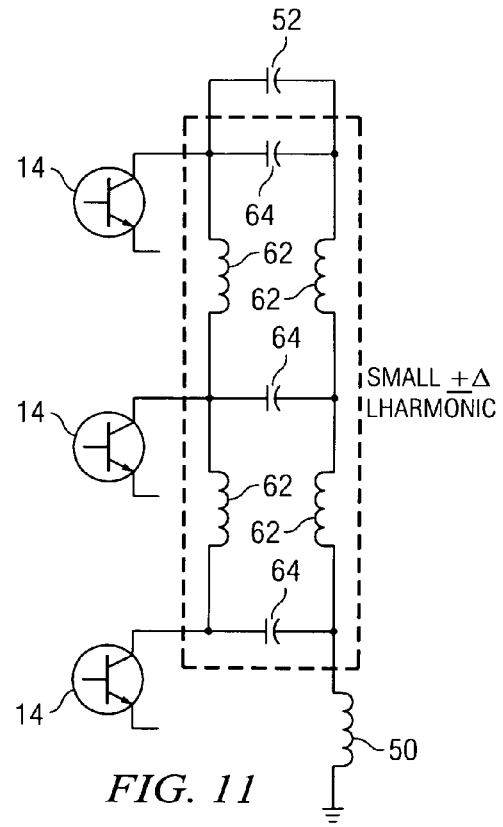
FIG. 11 depicts an electrical schematic of another embodiment of the present invention having a tuning capacitor disposed at the opposite end of the output cell array from the separate tuning inductor.

Referring to FIG. 11, there is shown the same schematic in FIG. 10 with the exception that the tuning capacitor 52 is disposed at the opposing end of the output cell array from the tuning inductor 50, as shown. For both circuits shown in FIGS. 10 and 11, both the individual and collective inductances of the interconnects 60 shown at 62 are substantially small, particularly in view of the inductance of the tuning inductor 50. Advantageously, any variances in the inductances 62 of the interconnects 60 have little effect on the harmonic tuning of the output cell array, even with differing path lengths, because the inductances between the outputs of the output cells 14 are vary small compared to the inductance of the harmonic turning inductor 50. Advantageously, harmonic tuning and accuracy of same is substantially improved. As with the low inductance interconnects, these output interconnects are also have inductances that are 5SOX smaller than the output interconnects shown in FIG. 8.

In one preferred embodiment, the low inductance interconnect 60 is formed by the overlap of opposing portions of metal-1 and metal-2, whereby the collector of output cells 14 is connected to metal-2, as is the output bond pads. This arrangement of the metal layers is configured to provide broadside coupling of signals thereon. The harmonic tuning inductor 50, however, as is the MIM capacitor 52, are connected to metal-1. The total harmonic tuning capacitance is the sum of capacitors 64 and the MIM capacitor 52.

Figure 12:
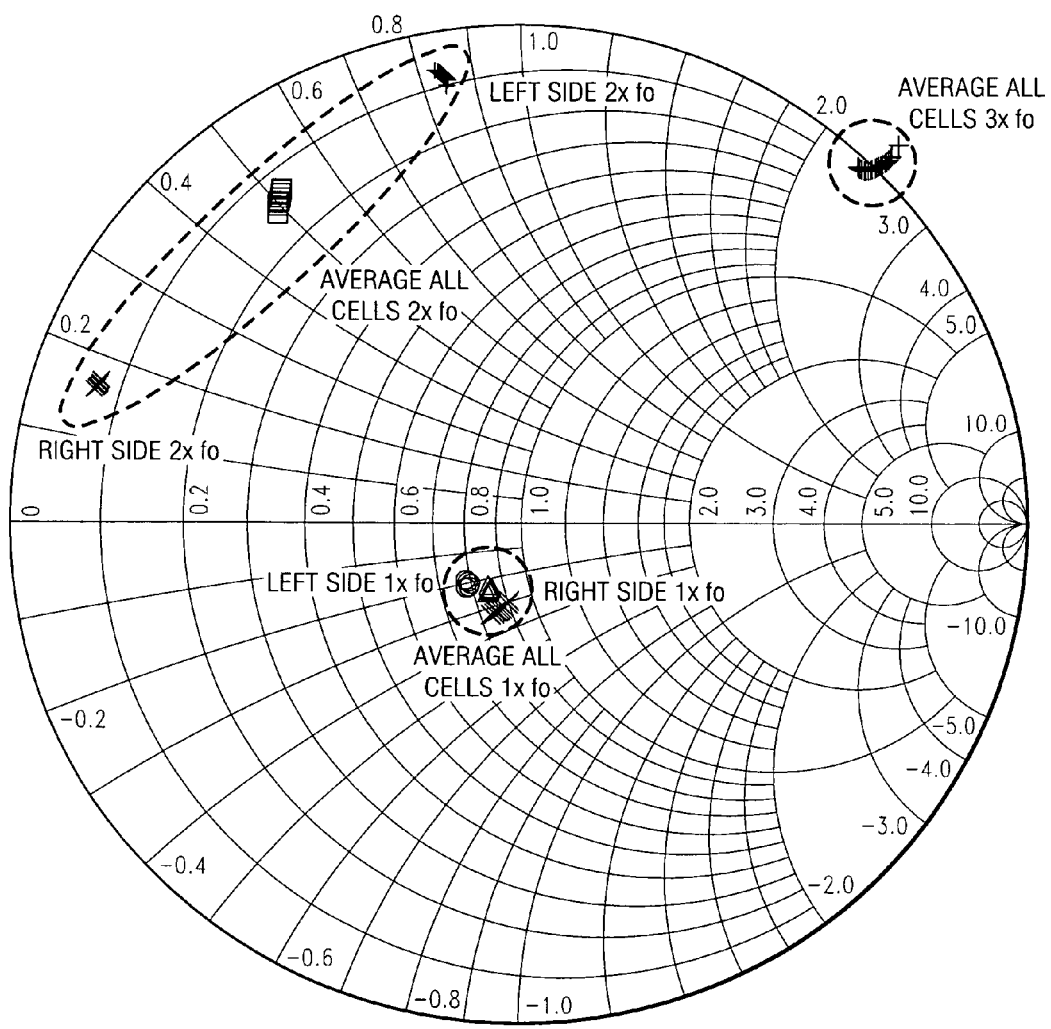
FIG. 12 is a Smith chart depicting variation in the terminating impedance of a conventional RFIC with a conventional interconnect.

Referring now to FIG. 12, there is depicted a Smith chart of the prior art circuit shown in FIG. 8, shown as having widely varying loads with one-sided harmonic turning.

Figure 13:
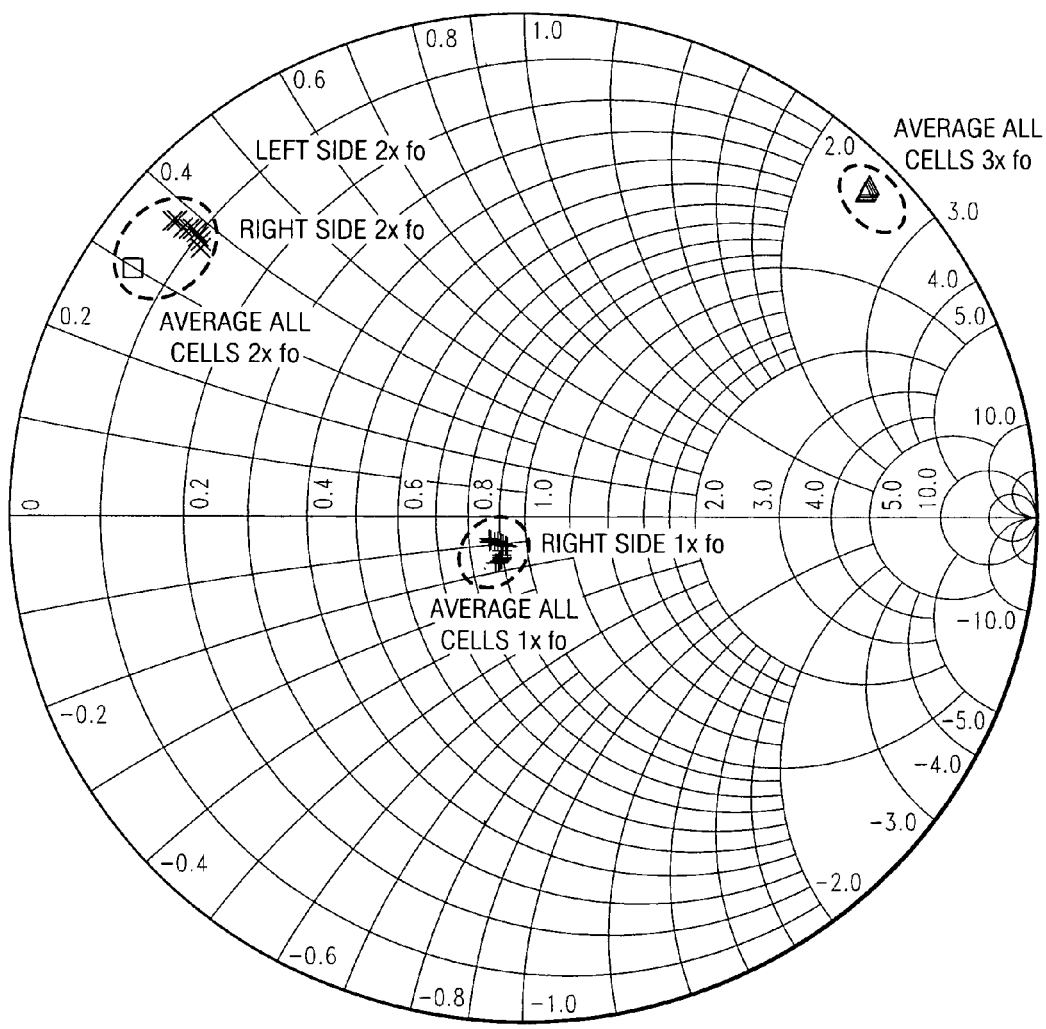
FIG. 13 depicts a Smith chart view of the terminating impedance found in an RFIC utilizing the improved low inductance interconnect of the present invention.

Referring now to FIG. 13, there is shown a Smith chart of the circuit shown in FIG. 9, with loads having one sided harmonic tuning and a BCB dielectric low Zo line. It can clearly be seen in FIG. 13 that the uniformity of second harmonic impedance termination is much better than in FIG. 12. Note the substantially different second harmonic terminating impedance between the left side end cell and the right side end cell while in FIG. 13 the left and right side terminating impedances are nearly identical. The fundamental frequency load impedance is nearly the same for both FIGS. 12 and 13.

Referring now to Table 1 below, there is shown the characteristic inductance (20), inductance (L) and capacitance (C) as a function of (W) for the equivalent circuit shown in FIG. 14.

| LOW ZO LINES REDUCE INTERCONNECT L | | | |
|---|---|---|---|
| W(um) | Zo(Ω) | L(nH)/MM | C(pF)/MM |
| 100 um GaAs | | | |
| 5.0 | 100.4 | 0.864 | 0.043 |
| 10.0 | 88.6 | 0.778 | 0.050 |
| 15.0 | 81.1 | 0.722 | 0.055 |
| 20.0 | 75.5 | 0.679 | 0.060 |
| 25.0 | 71.1 | 0.644 | 0.064 |
| 30.0 | 67.4 | 0.615 | 0.068 |
| 35.0 | 64.3 | 0.590 | 0.071 |
| 40.0 | 61.5 | 0.567 | 0.075 |
| 45.0 | 59.1 | 0.547 | 0.078 |
| 50.0 | 56.9 | 0.529 | 0.082 |
| 1.3 um BCB | | | |
| 5.0 | 33.1 | 0.157 | 0.072 |
| 10.0 | 21.0 | 0.104 | 0.117 |
| 15.0 | 15.5 | 0.078 | 0.163 |
| 20.0 | 12.3 | 0.062 | 0.207 |
| 25.0 | 10.2 | 0.052 | 0.252 |
| 30.0 | 8.7 | 0.045 | 0.297 |
| 35.0 | 7.6 | 0.039 | 0.342 |
| 40.0 | 6.7 | 0.035 | 0.386 |
| 45.0 | 6.1 | 0.032 | 0.431 |
| 50.0 | 5.5 | 0.029 | 0.475 |

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. An integrated circuit, comprising:
   a substrate;
   a first circuit disposed upon the substrate and configured to receive an input signal, and having an output configured to provide an output signal;
   a plurality of second circuits disposed upon the substrate and each having an input coupled to the first circuit output; and
   at least one interconnect coupled between the first circuit output and the second circuit inputs, the interconnect comprised of a first and a second metal layer separated by a dielectric material.

2. The integrated circuit as specified in claim 1 wherein the first and the second metal layers each have surfaces portions broadside coupled to one another.

3. The integrated circuit as specified in claim 1 wherein the at least one interconnect is disposed upon the substrate.

4. The integrated circuit as specified in claim 1 wherein a width of the first metal layer is greater than a width of the second metal layer.

5. The integrated circuit as specified in claim 1 wherein the first circuit delivers a driving current to the second circuits.

6. The integrated circuit as specified in claim 5 wherein the second circuits comprise an output amplifier.

7. The integrated circuit as specified in claim 6 wherein the output amplifier is configured to process an RF signal.

8. The integrated circuit as specified in claim 7 wherein the RF signal has a frequency of at least 500 MHz.

9. The integrated circuit as specified in claim 1 wherein the substrate is GaAs.

10. The integrated circuit as specified in claim 1 wherein the dielectric material is BCB (Cyclotene).

11. The integrated circuit as specified in claim 1 wherein the interconnect has a characteristic impedance of no greater than 12 ohms.

12. The integrated circuit as specified in claim 1 comprising a plurality of the interconnects coupling the first circuit output to a respective said second circuit.

13. The integrated circuit as specified in claim 1 wherein each of the second circuits are coupled to a common node via an interconnect comprising a pair of metal layers separated by a dielectric.

14. The integrated circuit as specified in claim 13 wherein the common node is disposed upon the substrate.

15. The integrated circuit as specified in claim 13 wherein the pair of metal layers each have a surface portion broadside coupled to one another.

16. The integrated circuit as specified in claim 6 wherein the output amplifier comprises of bipolar elements.

17. The integrated circuit as specified in claim 16 wherein the bipolar elements comprise of transistors having a collector coupled to a common node.

* * * * *